(12) United States Patent
Saggio et al.

(10) Patent No.: US 9,627,472 B2
(45) Date of Patent: Apr. 18, 2017

(54) SEMICONDUCTOR STRUCTURE WITH VARYING DOPING PROFILE AND RELATED ICS AND DEVICES

(71) Applicant: STMICROELECTRONICS S.R.L., Agrate Brianza (IT)

(72) Inventors: Mario Giuseppe Saggio, Aci Bonaccorsi (IT); Domenico Murabito, Catania (IT); Angelo Magri', Belpasso (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/824,813

(22) Filed: Aug. 12, 2015

(65) Prior Publication Data
US 2015/0349052 A1 Dec. 3, 2015

Related U.S. Application Data

(62) Division of application No. 12/868,023, filed on Aug. 25, 2010, now abandoned.

(30) Foreign Application Priority Data

Sep. 1, 2009 (IT) .............................. MI2009A1522

(51) Int. Cl.
*H01L 27/088* (2006.01)
*H01L 29/06* (2006.01)
(Continued)

(52) U.S. Cl.
CPC ........ *H01L 29/0634* (2013.01); *H01L 27/088* (2013.01); *H01L 29/0649* (2013.01);
(Continued)

(58) Field of Classification Search
CPC ... H01L 27/088; H01L 29/063; H01L 29/086; H01L 29/66712; H01L 29/7802
(Continued)

(56) References Cited

U.S. PATENT DOCUMENTS 6,174,773 B1 1/2001 Fujishima
6,228,719 B1 5/2001 Frisina et al.
(Continued)

FOREIGN PATENT DOCUMENTS

EP 1267415 12/2002
JP EP 1267415 A2 * 12/2002 ......... H01L 21/3247

OTHER PUBLICATIONS

Wolf et al.; Silicon Processing for the VLSI Era, vol. 1: Process Technology; Year 1986; Lattice Press, Sunset Beach, California; p. 124.*

(Continued)

*Primary Examiner* — Marcos D Pizarro
(74) *Attorney, Agent, or Firm* — Seed IP Law Group LLP

(57) ABSTRACT

An embodiment of a structure for a high voltage device of the type which comprises at least a semiconductor substrate being covered by an epitaxial layer of a first type of conductivity, wherein a plurality of column structures are realized, which column structures comprises high aspect ratio deep trenches, said epitaxial layer being in turn covered by an active surface area wherein said high voltage device is realized, each of the column structures comprising at least an external portion being in turn realized by a silicon epitaxial layer of a second type of conductivity, opposed than said first type of conductivity and having a dopant charge which counterbalances the dopant charge being in said epitaxial layer outside said column structures, as well as a dielectric filling portion which is realized inside said external portion in order to completely fill said deep trench.

32 Claims, 6 Drawing Sheets

(51) Int. Cl.
  *H01L 29/78* (2006.01)
  *H01L 29/08* (2006.01)
  *H01L 29/739* (2006.01)
  *H01L 29/10* (2006.01)
  *H01L 29/66* (2006.01)
  *H01L 29/417* (2006.01)

(52) U.S. Cl.
  CPC ........ *H01L 29/086* (2013.01); *H01L 29/1095* (2013.01); *H01L 29/66712* (2013.01); *H01L 29/7395* (2013.01); *H01L 29/7802* (2013.01); *H01L 29/7811* (2013.01); *H01L 29/41766* (2013.01)

(58) Field of Classification Search
  USPC .......................................................... 257/329
  See application file for complete search history.

(56) References Cited

U.S. PATENT DOCUMENTS

| | | | |
|---|---|---|---|
| 6,300,171 B1 | 10/2001 | Frisina | |
| 6,404,010 B2 | 6/2002 | Saggio et al. | |
| 6,410,958 B1 | 6/2002 | Usui et al. | |
| 6,586,798 B1 | 7/2003 | Frisina | |
| 6,803,626 B2* | 10/2004 | Sapp | H01L 29/0634 257/329 |
| 7,393,749 B2 | 7/2008 | Yilmaz et al. | |
| 7,498,619 B2 | 3/2009 | Saggio et al. | |
| 7,851,897 B1 | 12/2010 | Cate et al. | |
| 2001/0055861 A1 | 12/2001 | Patti et al. | |
| 2002/0100933 A1* | 8/2002 | Marchant | H01L 29/0634 257/330 |
| 2008/0038850 A1 | 2/2008 | Yamaguchi et al. | |
| 2008/0138953 A1 | 6/2008 | Challa et al. | |
| 2008/0224204 A1 | 9/2008 | Saggio et al. | |
| 2009/0001460 A1 | 1/2009 | Saggio et al. | |
| 2015/0325640 A1 | 11/2015 | Lorenti et al. | |

OTHER PUBLICATIONS

Wolf et al., "Silicon processing for the VLSI era", Process Technology, Lattice Press, Sunset Beach, CA, 1986, vol. 1, p. 124 See Priority Application U.S. Appl. No. 12/868,023, filed Aug. 25, 2010.

Rub et al., A novel trench concept for the fabrication of compensation devices:, IEEE, Cambridge, UK, Apr. 2003, pp. 203-206 See Priority Application U.S. Appl. No. 12/868,023, filed Aug. 25, 2010.

Nitta et al., Experimental results and simulation analysis of 250V super trench power MOSFET (STM), IEEE, Toulouse France, May 2000, pp. 77-80 See Priority Application U.S. Appl. No. 12/868,023, filed Aug. 25, 2010.

Liang et al., "Oxide-bypassed VDMOS (OBVDMOS): An alternative to superjunction high voltage MOS power devices", IEEE Electroni Device Letters, vol. 22, No. 8, Aug. 2001, pp. 407-409 See Priority Application U.S. Appl. No. 12/868,023, filed Aug. 25, 2010.

* cited by examiner

SEMICONDUCTOR STRUCTURE WITH VARYING DOPING PROFILE AND RELATED ICS AND DEVICES

TECHNICAL FIELD

An embodiment relates to a structure for a high voltage device.

More specifically, an embodiment relates to a structure for a high voltage device of the type which comprises at least a semiconductor substrate being covered by an epitaxial layer of a first type of conductivity, wherein a plurality of column structures are realized, which column structures comprises high aspect ratio deep trenches, the epitaxial layer being in turn covered by an active surface area wherein said high voltage device is realized.

An embodiment also relates to an integration process of a structure for a high voltage device of the type which comprises the steps of:

realizing a semiconductor substrate having a first conductivity type;
epitaxially growing on said semiconductor substrate an epitaxial layer having the first conductivity type; and
realizing in said epitaxial layer at least one deep trench having a high aspect ratio in order to realize at least one column structure in said epitaxial layer.

An embodiment particularly, but not exclusively, relates to a vertical conduction MISFET device which is driven through a gate dielectric and the following description is made with reference to this field of application for convenience of explanation only.

SUMMARY

As it is well known, in the field of high-voltage power semiconductor devices, several efforts have been addressed to provide solutions that improve the efficiency of these devices, and in particular obtain an increase of the breakdown voltage (BV) and a reduction of the output or on resistance (Ron) thereof.

In the development trend following the evolution of the high-voltage power devices, the approach that many think has the best compromise between breakdown voltage and on resistance is the so called SuperJunction approach, which provides for realizing a plurality of three-dimensional structures (3D) as drain structures. Different manufacturing methods of these three-dimensional drain structures are aimed at realizing a structure integrating columns or column structures, in particular having a first conductivity type, for instance of the p type, able to counterbalance the opposite charge, in particular of the opposite conductivity type, for instance the n type, of the drain layer wherein said column structures are realized, in particular in the portion of said layer extending between subsequent pairs of column structures.

These devices, so called multi drain (MD), thus work on the basis of the charge balance concept within the drain structure, being considered as the column structures and the drain layer as a whole.

Known solutions are described, for instance, in commonly assigned U.S. Pat. No. 6,228,719, U.S. Pat. No. 6,300,171, U.S. Pat. No. 6,404,010, U.S. Pat. No. 6,586,798 and U.S. Pat. No. 7,498,619 which are incorporated by reference, and which, in particular, relate to vertical-conduction power semiconductor devices of the multi drain type.

The devices disclosed in these documents substantially comprise, within a drain epitaxial layer, of a first conductivity type, charge balanced column structures, having a second conductivity type, opposed than the first type.

In particular, the column structures are realized with a dopant concentration which is substantially equal and opposite to the dopant concentration of the drain layer, so as to obtain a substantial charge balance which allows obtaining high breakdown voltages. Advantageously, by using a drain layer which has a high dopant concentration, devices may be realized which have a low on resistance and thus reduced conduction losses.

Generally, making column structures comprises a sequence of steps of growing epitaxial layers of the first conductivity type, for instance of the N type, each step being followed by a dopant implantation of the second conductivity type, for instance of the P type.

Regions of the P type being so implanted are in particular realized so as to be stacked up in the depth development sense of the drain epitaxial layer wherein they are made and are subjected to a following diffusion process of the dopant atoms, in such a way to originate uniform column structures.

Above the drain epitaxial layer, in contact with the column structures, active regions of the high-voltage device are realized, in particular body wells, the column structures thus providing extensions of said body wells inside the drain layer.

In essence, multi drain devices so realized may combine a high cut-off voltage with reduced losses thanks to the charge balance between a conduction region, namely the drain region between the columns and the column structures extending into the drain layer, which allow increasing the concentration of such a conduction region, thus obtaining a strong reduction of conduction losses.

Other methods for realizing multi drain devices having a charge compensation are known, for example, from the articles: "A Novel Trench Concept for the Fabrication of Compensation Devices" to Rüb et al., ISPSD, Apr. 14-17, 2003, Cambridge, UK, "Oxide-Bypassed VDMOS (OBVDMOS): An Alternative to Superjunction High Voltage MOS Power Devices" to Liang et al., IEEE Electron Devices Letters, Vol. 22, No. 8, August 2001, and "Experimental Results and Simulation Analysis of 250V Super Trench Power MOSFET (STM)" to Nitta et al., Mitsubishi Electric Co., ULSI Development Center, 12th International symposium on power semiconductor devices & Ics, Toulouse, May 22-25, 2000 as well as from US Patent Application No. US 2001/0055861 published on Dec. 27, 2001 in the name of Patti et al. and from U.S. Pat. No. 6,410,958 issued on Jun. 25, 2002 to Usui et al., all of the above references being incorporated by reference.

Although advantageous in several aspects, the known solutions to realize multi-drain devices may comprise a high number of process steps, thus possibly being difficult to implement. Moreover, it often occurs that the dopant profile in the conduction region is not constant.

Finally, these known solutions may not easily allow extending the voltage class of the multi-drain devices so obtained.

Therefore, an embodiment of the present disclosure is a structure for a high-voltage device having structural and functional characteristics which overcome at least one of the limits and drawbacks which still affect the devices realized according to the prior art.

An embodiment is a structure for a high-voltage device through a superjunction structure obtained by partially filling a deep trench having a high aspect ratio, in particular having a ratio between width and height less than 3/20, with an epitaxial layer doped in opposition with the preexisting semiconductor layer thus forming the column structures. The quantity of dopant being in the epitaxial layer would be the one counterbalancing the dopant being in the neighbouring conduction areas, i.e., the epitaxial layer outside the column structures. The structure also comprises a dielectric layer able to fill said deep trench, being partially filled by said epitaxial layer.

In an embodiment, the column structures are structures of the drain area and turn out to have a same periodicity of the active surface areas, being wells realizing body areas, each drain column structure being "fastened" to a corresponding body well.

In an embodiment, a structure for a high-voltage device comprises at least a semiconductor substrate being covered by an epitaxial layer of a first type of conductivity, wherein a plurality of column structures are realized, which column structures comprise high-aspect-ratio deep trenches, said epitaxial layer being in turn covered by an active surface area wherein said high voltage device is realized, the column structures comprising at least an external portion being in turn realized by a silicon epitaxial layer of a second type of conductivity, opposed to said first type of conductivity and having a dopant charge which counterbalances the dopant charge being in said epitaxial layer outside said column structures, as well as a dielectric filling portion which is realized inside said external portion in order to completely fill said deep trench.

According to an embodiment, said epitaxial layer of said external portion is U-shaped and extends both on the wall and on the bottom of a corresponding column structure.

According to a further embodiment, said external portion could have a dopant concentration with a constant concentration dopant profile and with a transition zone towards said epitaxial layer outside said column structures having a smaller size than a thickness of a silicon epitaxial layer of said external portion.

Furthermore, according to an embodiment, said external portion may have a dopant concentration with a growing dopant profile towards an interface with said epitaxial layer outside said column structures.

According to an embodiment, said external portion may have a dopant concentration with a substantially constant concentration dopant profile.

Alternatively, said external portion may have a dopant concentration with a variable concentration profile having a maximum near said interface with said epitaxial layer.

According to another embodiment, the thickness of said external portion may be constant along its whole U-shaped profile.

According to another embodiment, said column structures may have a ratio between width and height less than 3/20.

According to yet another embodiment, said column structures may realize a first active area of said high voltage device and said high voltage device comprises at least a second active area which is realized in said active surface area and has at least one fastening zone with said first active area.

According to an embodiment, the said first active area may be fastened in correspondence with said fastening zone to a conduction portion of said first active area.

According to an embodiment, said conduction portion of said first active area may be an external portion of said column structures.

According to an embodiment, said high voltage device is a MOS transistor and said first active area is a drain area comprising said epitaxial layer and said column structures and said second active area is a body area.

According to an embodiment, said high-voltage device could comprise, in said active surface area, a plurality of body wells of said second type of conductivity, inside which corresponding plurality of source wells of said first type of conductivity are realized, as well as a plurality of gate structures, being realized between consecutive pairs of column structures, above a channel region being define in said epitaxial layer between said body wells and in contact with said source wells.

Yet according to an embodiment, said structure for a high-voltage device may further comprise a capping layer, being realized on said high-voltage device and in particular covering said gate structures.

According to an embodiment, said gate structures are chosen between planar type and trench gate type structures.

Moreover, according to an embodiment, said structure for a high-voltage device may further comprise contact surface structures being chosen between microtrench type or conventional structures.

According to an embodiment, said column structures may have a same periodicity with respect to said second active areas.

According to an embodiment, each of said column structures may have a width between approximately 1.5 and 4 um, for example approximately 2 um and a height between approximately 10 and 70 um, for example approximately 30 um.

According to an embodiment, said external portion may have a dopant concentration between approximately $1e^{15}$ and $1e^{17}$, for example approximately $1e^{16}$ at/cm3, and said epitaxial layer may have a dopant concentration between approximately $5e^{14}$ and $5e^{16}$, for example approximately $5e^{15}$.

Furthermore, according to an embodiment, said column structures may have a distance between approximately 2 um and 8 um, for example approximately 4 um.

According to an embodiment, said column structures may extend down to said semiconductor substrate.

According to an embodiment, said column structures may extend down to a prefixed distance from said semiconductor substrate.

According to an embodiment, said high-voltage device is chosen between a MOS transistor, a diode, and an IGBT device.

An embodiment of an integration process for a structure for a high voltage device comprises the steps of:
realizing a semiconductor substrate having a first conductivity type;
epitaxially growing on said semiconductor substrate an epitaxial layer having said first conductivity type;
realizing in said epitaxial layer at least one deep trench having a high aspect ratio in order to realize at least one column structure in said epitaxial layer;
an epitaxial growing step within said trench of a silicon layer being doped and having a second conductivity type, opposed to said first conductivity type and having a dopant charge which counterbalances a dopant charge being in said epitaxial layer outside said column structures; and
a filling step of said trench by means of a filling dielectric layer in order to realize a filling portion of said at least one column structure.

According to an embodiment, said epitaxial growing step within said trench may grow a silicon layer at least on the walls and on the bottom of said trench, thus realizing an U-shaped external portion of said at least one column structure According to an embodiment, said epitaxial growing steps of said epitaxial layer on said semiconductor substrate and of said epitaxial layer within said trench may be realized with a limited thermal budget and with a process maximum temperature less than approximately 1100° C.

According to an embodiment, said epitaxial growing steps may realize said epitaxial layer within said trench with a dopant concentration comprised between approximately $1e^{15}$ and $1e^{17}$, for example $1e^{16}$ at/cm3, and said epitaxial layer on said semiconductor substrate with a dopant concentration comprised between approximately $5e^{14}$ and $5e^{16}$, for example approximately $5e^{15}$.

According to an embodiment, said column structures may realize a first active area of said high-voltage device and may comprise a step of realizing, in an active surface area of said structure, at least one second active area which has at least one fastening zone with said first active area.

According to an embodiment, said integration process may integrate a MOS transistor of the multi-drain type, by realizing, as the first active area, a drain area which comprises said epitaxial layer and said column structures and, as the second active area, a body area.

According to an embodiment, the integration process may integrate a diode by realizing, as the first active area, a cathode area and, as the second active area, an anode area.

BRIEF DESCRIPTION OF THE DRAWINGS

Characteristics and advantages of at least one embodiment of a structure for a high-voltage device and corresponding integration process will be apparent from the following description, which is given by way of indicative and non-limiting example with reference to the annexed drawings.

DETAILED DESCRIPTION

Figure 1:
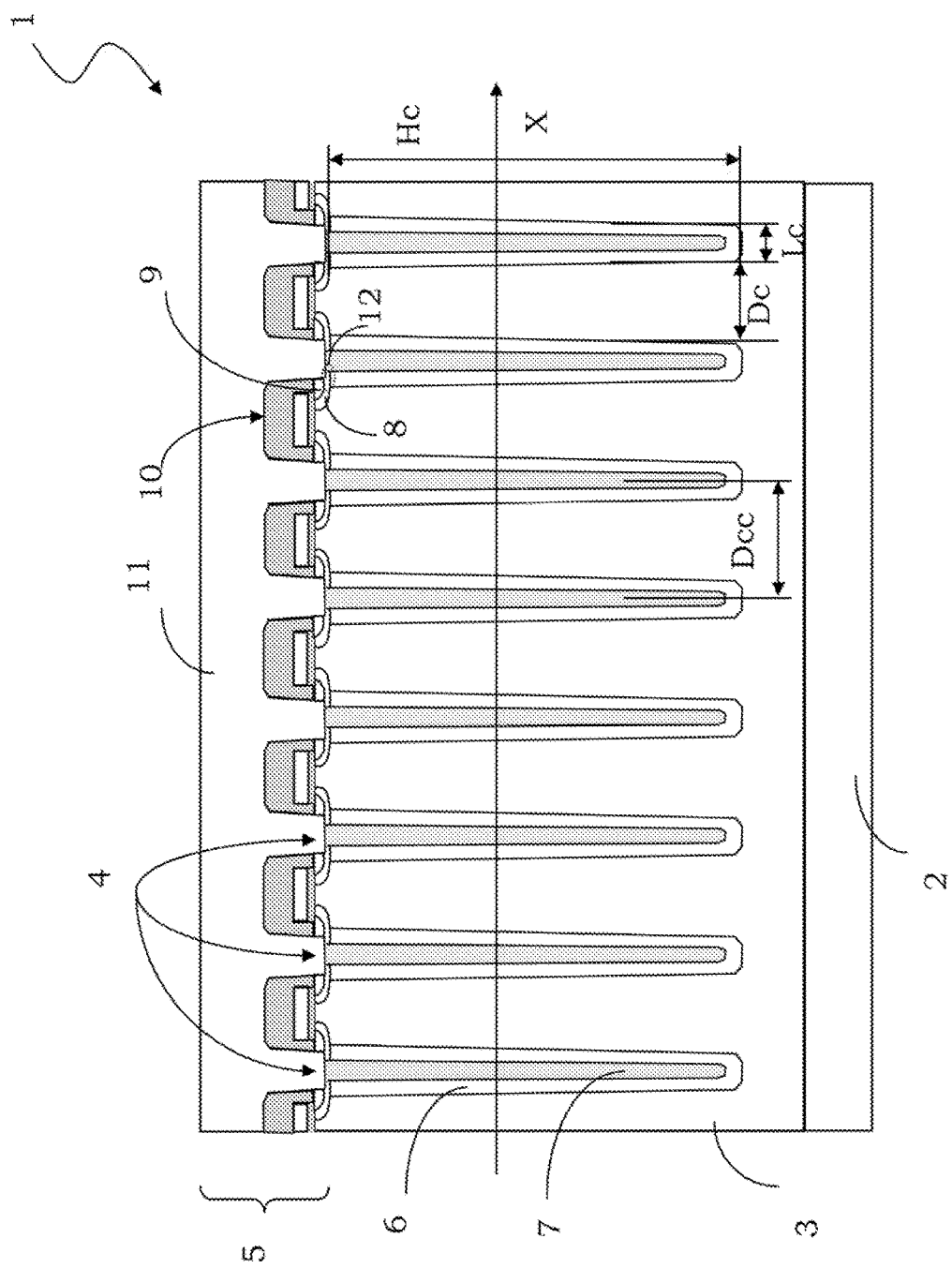
FIG. 1 schematically shows a section view of an embodiment of a structure for a high-voltage device.

With reference to such figures, and in particular to FIG. 1, 1 globally and schematically indicates an embodiment of a structure for a high-voltage device.

It is suitable to note that figures showing schematic portions of the integrate structure may not be drawn to scale, but are drawn in such a way to show features of at least one embodiment.

Moreover, process steps as herein below described may not form a complete process flow for manufacturing high-voltage devices. An embodiment may be reduced into practice using techniques for manufacturing high-voltage devices as currently used into the field, and, so a discussion of these conventional process steps may be omitted for brevity.

In an embodiment a structure 1 for a high-voltage device comprises a semiconductor substrate 2 covered by an epitaxial layer 3, having a first conductivity type, for example N type. A plurality of column structures 4 having a relatively high-aspect ratio, for example less than about 3/20, is realized in the epitaxial layer 3.

The structure 1 for a high-voltage device further includes an active surface area 5, wherein the active areas of the high-voltage device are realized, as will be discussed in the following description.

Each of the column structures 4 includes an external portion 6, for example an epitaxial silicon layer being suitably doped, as well as a filling portion 7, for example a dielectric layer, such as an oxide, being deposited inside the respective column structure 4 for, e.g., completely filling it. The epitaxial silicon layer of the external portion 6 is doped and has a second conductivity type, for example the P type.

The charge that is epitaxially inserted in order to realize the external portion 6 is such as to counterbalance the charge being in the epitaxial layer 3 outside the column structures 4. Moreover, the epitaxial layer that realizes the external portion 6 is on the walls and on the bottom of the corresponding column structure 4, which is realized, per the following description, starting from a trench being dug in the epitaxial layer 3, for example a deep trench having a high aspect ratio, i.e., a low ratio between width and height, for example less than about 3/20.

In the active surface area 5, a high-voltage device is realized, in a conventional manner, of the type comprising at least an active area 8.

The column structures 4 have respective fastening zones 12 with the active areas 8, having a same periodicity thereof.

In particular, an embodiment of the structure 1 for a high-voltage device comprises column structures 4 in turn realized by a U-shaped zone of semiconductor material, i.e., the external portion 6 of the epitaxial silicon, being suitably doped with a dopant of an opposite type with respect to the one of the neighboring semiconductor material, i.e., the epitaxial layer 3 outside the column structures 4, this U-shaped external portion 6 being in turn filled by a dielectric layer to form the filling portion 7.

It is suitable to note that, the U-shaped external portion 6 may have an approximately constant thickness and an approximately constant concentration dopant profile having a transition zone shifted towards the semiconductor material of the neighboring epitaxial layer 3, this zone having a smaller size than the thickness of the silicon epitaxial layer of the external portion 6 (in particular, extending for a distance that is less than around ⅕ of the thickness of the external portion 6), as is discussed below.

Moreover, the charge quantity being in the epitaxial silicon layer of the U-shaped external portion 6 of the column structures 4 is such that a balance of the charge is obtained with respect to the epitaxial layer 3 outside the column structures 4 themselves.

In the example of FIG. 1, a MOS transistor of the multi-drain type is realized.

Therefore, in the example as shown, the MOS transistor comprises a drain epitaxial layer 3 being provided with a plurality of column structures 4 and an active surface area 5 wherein a plurality of body wells 8 are realized, having the second conductivity type, for example the P type, inside which a corresponding plurality of source wells 9, of the first conductivity type, for example the N type, are realized.

An embodiment of the high-voltage MOS device of the example of FIG. 1 is completed by realizing a plurality of gate structures 10, being realized between consecutive pairs of column structures 4, above a channel region, being defined in the drain epitaxial layer 3 between the body wells 8 and the source wells 9.

An embodiment of the structure 1 for a high-voltage device may further include a covering or capping layer 11, being realized above the whole high-voltage device and, for example, covering the gate structures 10.

Finally, in an embodiment, the structure 1 for a high-voltage device may be provided, in a known manner, with surface contact structures of a microtrench or a conventional type.

Moreover, the gate structures 10 may be of the planar type or of the trench gate type.

In an embodiment the drain column structures 4, having a same periodicity as the body wells 8, have respective fastening zones 12 with the body wells 8 themselves. In particular, each of the column structures 4 comprises a pair of fastening zones 12 with the body wells 8, which bounds the column structure at the upper side.

In an embodiment of the structure 1 for a high-voltage device, each of the column structures 4 has a width Lc between approximately 1.5 and 4 um, for example, about 2 um, and a height Hc between approximately 10 and 70 um, for example, about 30 um, thus defining a maximum value of an aspect ratio of the deep trench which constitutes the column structures 4 equal to about 3/20.

Moreover, according to an embodiment, the epitaxial layer that realizes the external portion 6 has a dopant concentration between approximately $1e^{15}$ and $1e^{17}$, for example about $1e^{16}$ at/cm3, while the drain epitaxial layer 3 has a dopant concentration between approximately $5e^{14}$ and $5e^{16}$, for example about $5e^{15}$.

In an embodiment, the column structures 4 are separated by a distance Dc between approximately 2 um and 8 um, for example about 4 um, and by a distance Dcc between the symmetry axes of the column structures 4 between approximately 2.5 um and 12 um, for example about 6 um.

In an embodiment, the structure 1 for a high-voltage device realizes about a 600V device.

By varying the height Hc of the column structures 4, it is however possible to obtain high voltage devices from, for example, about 300V up to about 2000V.

Figure 2A:
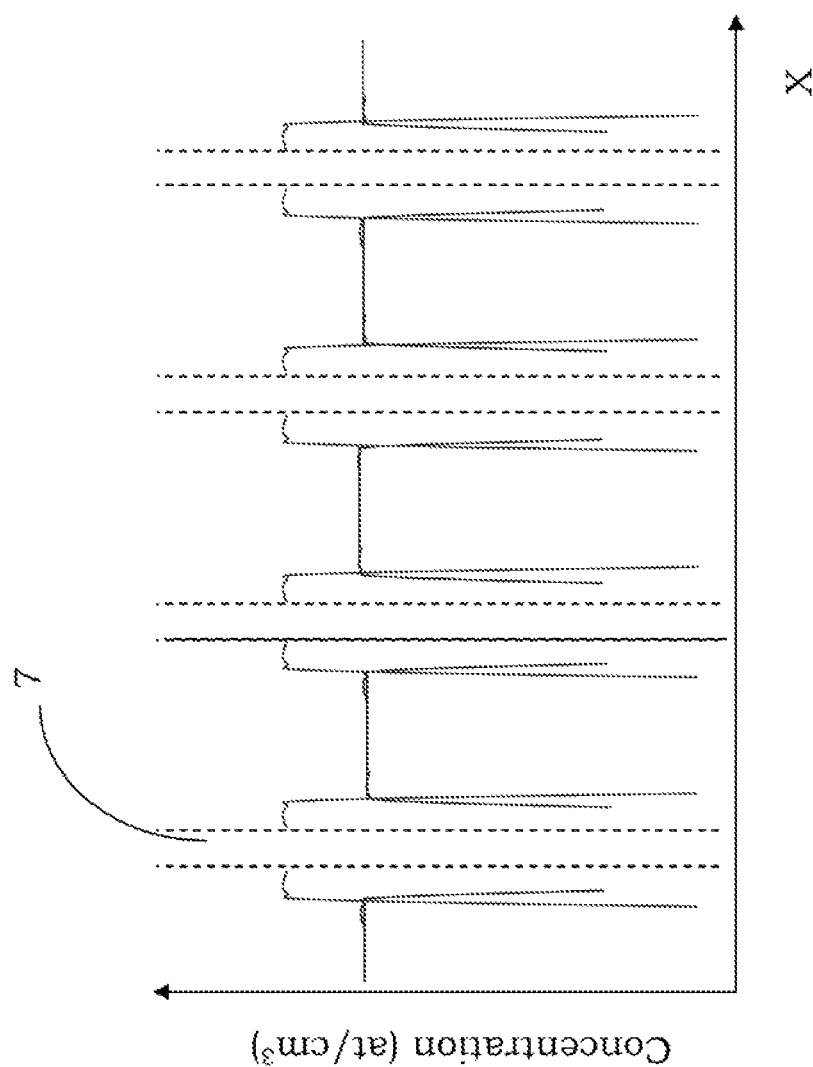
FIGS. 2A and 2B schematically show the dopant concentration profiles of different embodiments of the structure of FIG. 1.

The dopant concentration along the axis X of the column structures 4 of an embodiment of the structure 1 for a high-voltage device is shown in FIG. 2A, X being the longitudinal development axis of the structure 1 itself, as also indicated in FIG. 1. In particular, the charge epitaxially introduced into the epitaxial layer which realizes the U-shaped external portion 6 of the column structures 4 is such that it counterbalances the charge being in the epitaxial layer 3 outside the column structures 4 themselves, the filling portion 7 of such column structures 4 being instead realized by an oxide.

In an embodiment, the dopant profile is thus almost devoid of a transient in the N conduction zone, i.e., in the epitaxial layer 3. In particular, the U-shaped external portion 6 has an approximately constant thickness and an approximately constant concentration dopant profile and with a narrow transition zone of, for example, N dopant shifted towards the semiconductor material of the neighboring epitaxial layer 3, which extends for a smaller distance than the thickness of the silicon epitaxial layer of the external portion 6 (for example, extending for a distance that is less than around ⅕ of the thickness of the external portion 6).

Figure 2B:
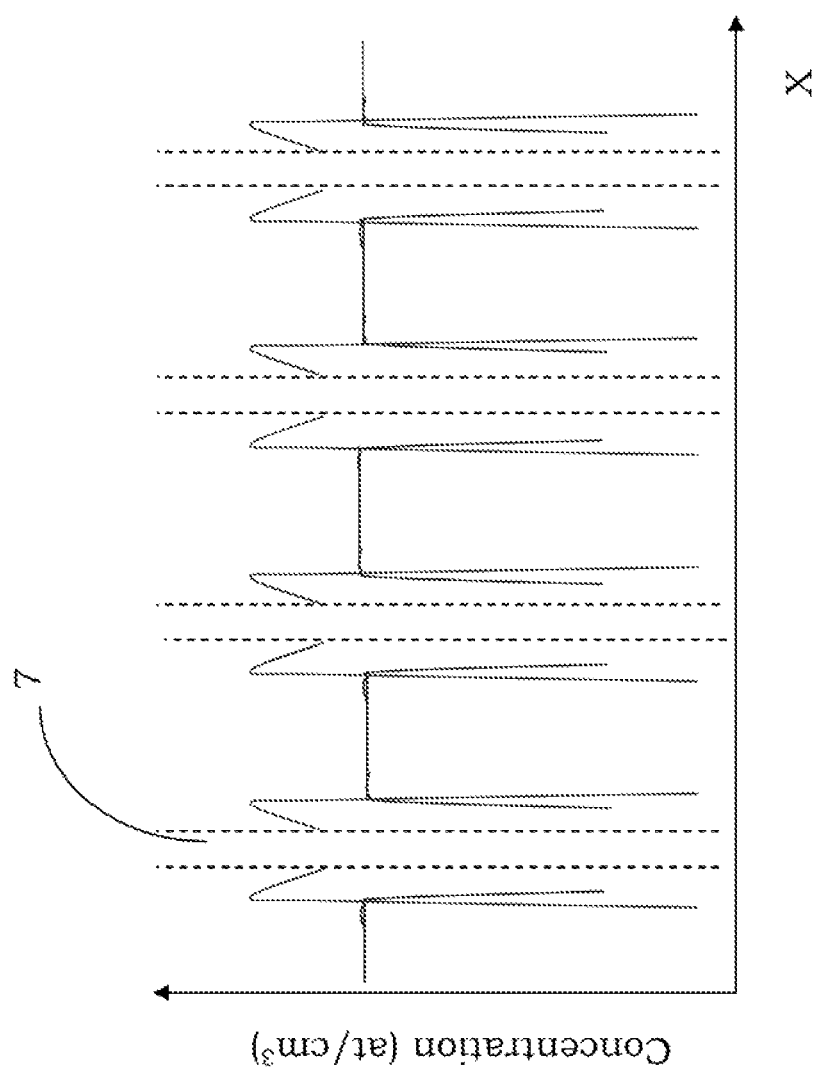

Analogously, in FIG. 2B a dopant concentration profile along the column structures 4 of an embodiment of the structure 1 for a high-voltage device is shown, X being the longitudinal development axis of the structure 1 itself.

According to this embodiment, the dopant in the epitaxial layer forming the U-shaped external portion 6 of the column structures 4 is not constant, but it has a peak in correspondence with the interface with the epitaxial layer 3 outside the column structures 4 themselves.

According to an embodiment, the manufacturing process of the structure 1 for a high-voltage device turns out to be well controlled since it is able provide a charge balance between the U-shaped external portion 6 of the column structures 4 and the epitaxial layer 3 outside them (e.g., between the N zone and the P zone) without needing an extremely fine control of the thickness of the silicon epitaxial layer as grown in order to realize the U-shaped external portion 6. In particular, an embodiment, changes of the thickness of the external portion 6 may cause little change to the total charge amount being contained in the silicon epitaxial layer of such external portion 6, thus making implementation of the process easier.

While in an embodiment as shown in FIG. 1 the column structures 4 do not reach the semiconductor substrate 2, it is possible to have an embodiment in which they reach it.

Moreover, it may be possible to realize in the active surface area 5 a high voltage device different from a MOS transistor, such as for example a diode or an IGBT device.

It may be possible to consider an embodiment of the structure 1 for a high-voltage device as including a first active area being realized by the column structures 4 and a second active area 8, and having at least one fastening zone 12 within the first active area.

In an embodiment, the second active area is "fastened" in correspondence with the fastening zone 12 to a conductive portion of the first active area, in particular of the column structures.

In an embodiment shown in FIG. 1, making a MOS transistor of the multi-drain type, the first active area is the drain area while the second one is the body area. In the case, for instance, of a diode, such first and second active areas would be the cathode and anode areas (or vice versa depending on the conductivities of these areas.

Also in the exemplary case of FIG. 1, the second active area is "fastened" in correspondence with the fastening zone 12 to the external portion 6 of the column structure 4, being a conductive portion of the first active area.

An embodiment also relates to an integration process of an embodiment of a structure 1 for a high-voltage device of the above indicated type.

Figure 3B:
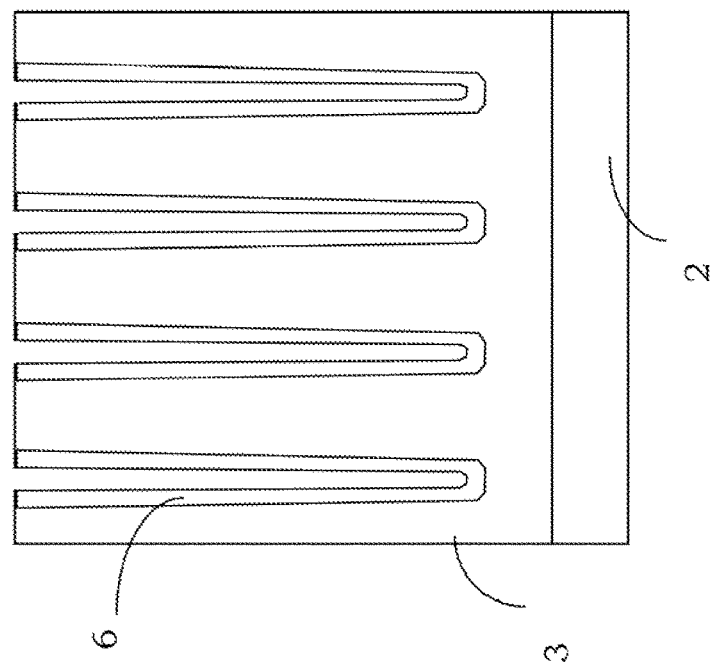
FIGS. 3A-3D schematically show section views of the structure of FIG. 1 during different steps of an embodiment of an integration process.
Figure 3A:
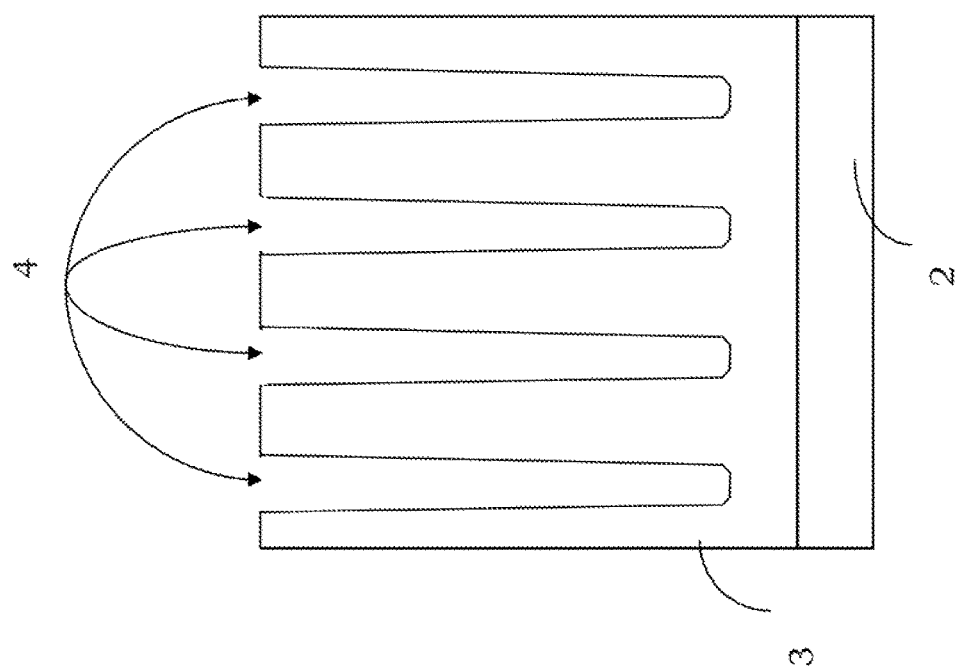

An embodiment of integration process includes the steps of:

realizing a semiconductor substrate 2 having a first conductivity type;

epitaxially growing on such semiconductor substrate 2 an epitaxial layer 3 having the first conductivity type; and realizing in said epitaxial layer 3 at least a deep trench having a high aspect ratio in order to realize at least one column structure, as schematically shown in FIG. 3A.

Next, within the trench is grown a silicon layer 6, being placed at least on the walls and on the bottom of the trench so as to realize an external portion of a column structure 4 being thus formed in the epitaxial layer 3.

The epitaxial layer 6 having been grown to form such an external portion is doped with a dopant of a second type and in such a way that the dopant charge being epitaxially introduced approximately counterbalances the charge of the dopant of the first type of the epitaxial layer 3 surrounding the trench, as schematically shown in FIG. 3B.

The steps of epitaxially growing the drain epitaxial layer 3 and the epitaxial layer 6 of the external portion of the column structures are realized with a limited thermal budget and a maximum process temperature less than about 1100° C. In this way, the process turns out to be compatible also with large-sized wafers (for instance of 8" or 12") and it is possible to minimize the transition zone between the column structures 4 and the conduction zones, i.e., the portions of the drain epitaxial layer 3 outside said column structures 4.

In other words, a process having a low thermal budget is used in order to keep almost unaltered the dopant distribution inside the epitaxial layer 6 having been grown inside the trench which makes the column structures.

For example, the epitaxial growing steps realize the epitaxial layer 6 with a dopant concentration between about $1e^{15}$ and $1e^{17}$, for example about $1e^{16}$ at/cm3, and a drain epitaxial layer 3 with a dopant concentration between about $5e^{14}$ and $5e^{16}$, for example about $5e^{15}$.

Figure 3D:
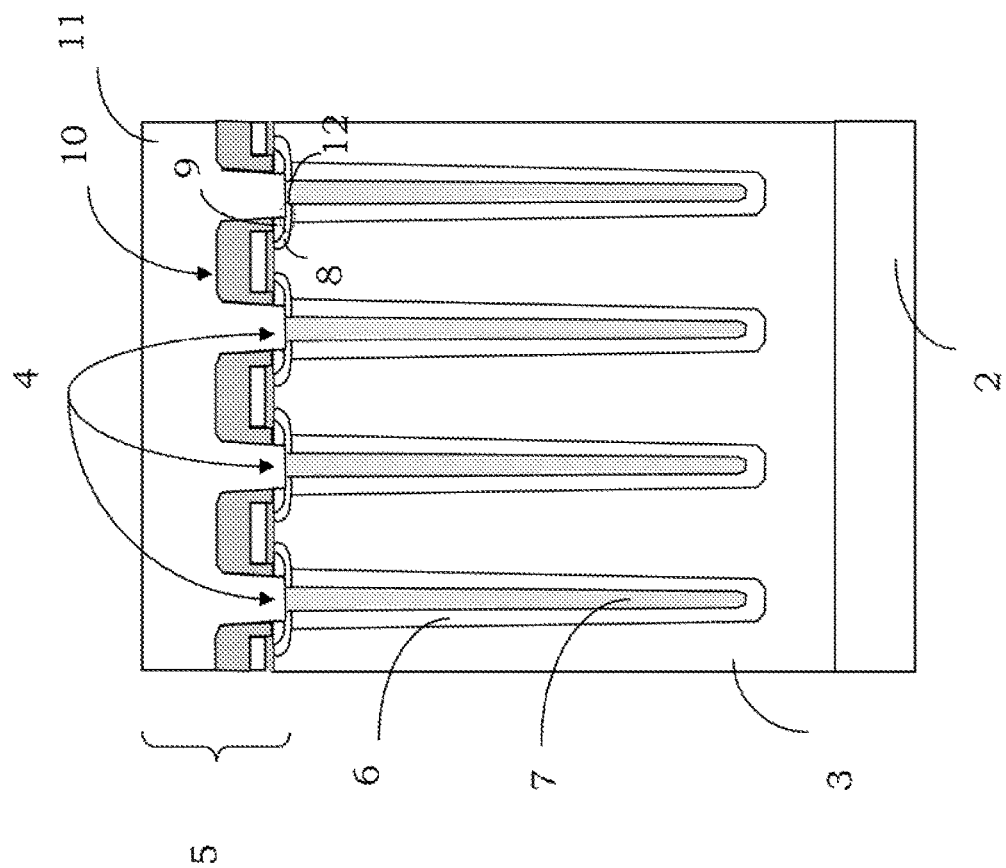
Figure 3C:
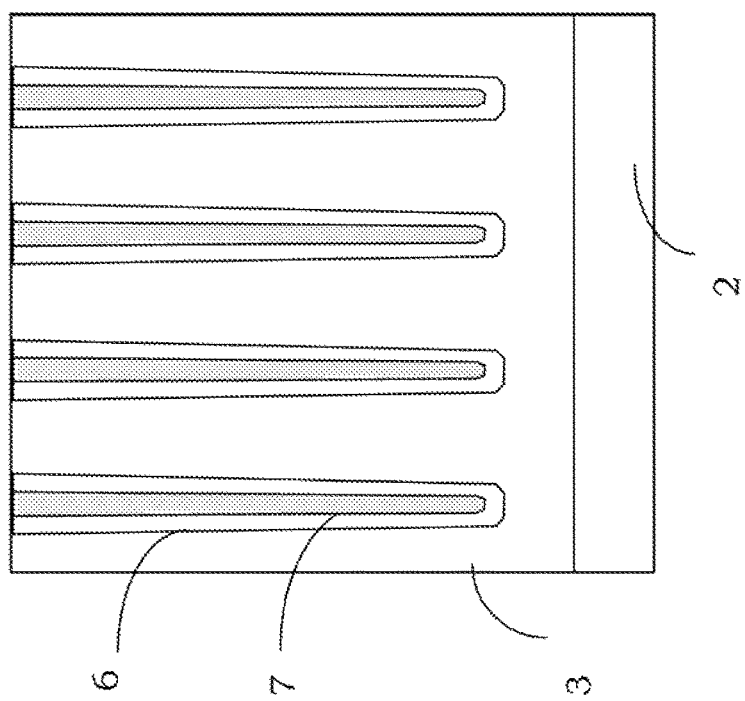

Furthermore, the process may include a filling step of the trench by means of a filling dielectric layer 7, for example an oxide, in order to realize a filling portion of the column structure 4, as schematically shown in FIG. 3C.

This filling step by means of the filling dielectric layer 7 e.g., completely fills the trench to prevent voids from forming in the column structure 4.

The process then includes a step of realizing, in an active surface area 5 of the structure 1, a high voltage device comprising at least an active area. For example, as in the example shown in FIG. 1, the high-voltage device is a MOS transistor of the multi-drain type comprising a drain area being realized by the epitaxial layer 3 and the column structures 4 and comprising source wells 9 being realized in body wells 8, these latter having been realized in contact with the column structures 4 in correspondence with fastening zones 12, as well as gate structures 10 being realized over channel regions being defined in the body wells 8 and in contact with the source wells 9, as schematically shown in FIG. 3D.

An embodiment of the above described integration process has a lower number of steps than a conventional technology of integration of multi-drain transistors, and thus may be easier to implement.

Moreover, in an embodiment, the charge balance being realized by the epitaxial layer 6 of the external portion of the column structures 4 with respect to the epitaxial layer 3 which surrounds them, allows obtaining a constant dopant profile in the conduction zone, the extension of the voltage class of the high voltage device so obtained being thus easier.

In an embodiment the use of an epitaxial growing step of the layer 6 allows eliminating at least one problem of an implant angle tied to the high aspect ratio of the trench, with a better doping control of the external portion (i.e. the epitaxial layer 6) of the column structures 4.

For example, it may be possible, by using a drain layer of the P type and column structures of the N type, to obtain a structure for a high-voltage device of a dual type.

A system, such as an automobile, may include device having an embodiment of the structure 1 of FIG. 1.

Figure 4A:
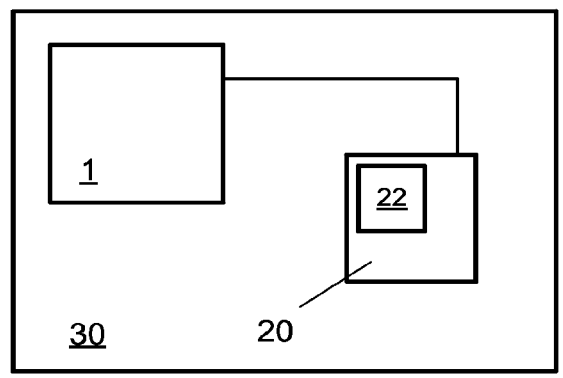
FIG. 4A depicts a system having a first integrated circuit and a second integrated circuit on a same die, according to one embodiment.
Figure 4B:
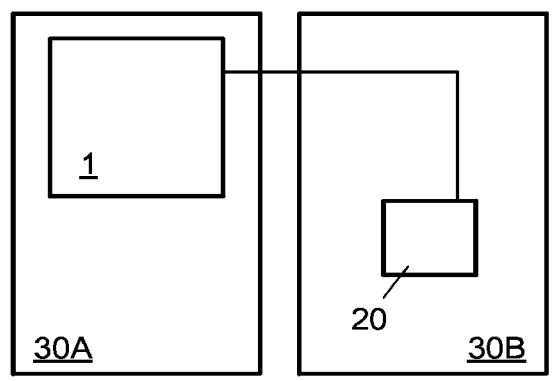
FIG. 4B depicts a system having a first integrated circuit and a second integrated circuit on respective dies, according to one embodiment.

FIG. 4A depicts a system having an embodiment that includes an integrated circuit of structure 1 of FIG. 1 on a die 30. A second integrated circuit 20 may be coupled to the structure 1. The second integrated circuit may comprise a controller 22. FIG. 4B depicts a system having an embodiment of the structure 1 of FIG. 1 on a first die 30A and including a second integrated circuit on a second die 30B coupled to the structure 1.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. An integrated circuit (IC) comprising:
a substrate; and
a plurality of transistors in said substrate, each transistor comprising
a source region of a first conductivity type,
a gate region adjacent said source region,
a semiconductor layer of the first conductivity type and having a plurality of trenches extending therein, said semiconductor layer defining a drain region,
a first epitaxial semiconductor layer of a second conductivity type lining said plurality of trenches,
a first insulator layer in said first epitaxial semiconductor layer, and
a first body region of the second conductivity type extending from the gate region to said first insulator layer so that said first epitaxial semiconductor layer is spaced apart from said source region,
said first epitaxial semiconductor layer having a varying doping profile between the semiconductor layer and said first insulator layer, the varying doping profile having a peak dopant concentration opposite said first insulator layer.

2. The IC of claim 1 wherein the semiconductor layer comprises an epitaxial layer.

3. The IC of claim 1 wherein the first conductivity type comprises N-type conductivity.

4. The IC of claim 1 wherein the second conductivity type comprises P-type conductivity type.

5. The IC of claim 1 wherein the first insulator layer comprises an oxide.

6. The IC of claim 1 wherein said gate region comprises:
a gate insulator layer over the first body region; and
a gate contact layer over the gate insulator layer.

7. The IC of claim 1 further comprising:
a body extension region of the second conductivity type in the first epitaxial semiconductor layer adjacent to the first body region; and
wherein said gate region comprises:
a gate insulator layer over the first body region; and
a gate contact layer over the gate insulator layer.

8. An electronic device comprising:
a plurality of integrated circuits (ICs), at least one IC comprising:
a substrate; and
a plurality of transistors in said substrate, each transistor comprising
a source region of a first conductivity type,
a gate region adjacent said source region,
a semiconductor layer of the first conductivity type and having a plurality of trenches extending therein, said semiconductor layer defining a drain region,
a first epitaxial semiconductor layer of a second conductivity type lining said plurality of trenches,
a first insulator layer in said first epitaxial semiconductor layer, and
a first body region of the second conductivity type extending from the gate region to said first insulator layer so that said first epitaxial semiconductor layer is spaced apart from said source region, said first epitaxial semiconductor layer having a varying doping profile between the semiconductor layer and said first insulator layer, the varying doping profile having a peak dopant concentration opposite said first insulator layer.

9. The electronic device of claim 8 wherein the semiconductor layer comprises an epitaxial layer.

10. The electronic device of claim 8 wherein the first conductivity type comprises N-type conductivity.

11. The electronic device of claim 8 wherein the second conductivity type comprises P-type conductivity type.

12. The electronic device of claim 8 wherein the first insulator layer comprises an oxide.

13. The electronic device of claim 8 wherein said gate region comprises:
a gate insulator layer over the first body region; and
a gate contact layer over the gate insulator layer.

14. The electronic device of claim 8 further comprising:
a body extension region of the second conductivity type in the first epitaxial semiconductor layer adjacent to the first body region; and wherein said gate region comprises:
a gate insulator layer over the first body region; and
a gate contact layer over the gate insulator layer.

15. A semiconductor structure comprising:
a source region of a first conductivity type;
a gate region adjacent said source region;
a semiconductor layer of the first conductivity type and having a plurality of trenches extending therein, said semiconductor layer defining a drain region;
a first epitaxial semiconductor layer of a second conductivity type lining said plurality of trenches;
a first insulator layer in said first epitaxial semiconductor layer; and
a first body region of the second conductivity type extending from the gate region to said first insulator layer so that said first epitaxial semiconductor layer is spaced apart from said source region;
said first epitaxial semiconductor layer having a varying doping profile between the semiconductor layer and said first insulator layer, the varying doping profile having a peak dopant concentration opposite said first insulator layer.

16. The semiconductor structure of claim 15 wherein the semiconductor layer comprises an epitaxial layer.

17. The semiconductor structure of claim 15 wherein the first conductivity type comprises N-type conductivity.

18. The semiconductor structure of claim 15 wherein the second conductivity type comprises P-type conductivity type.

19. The semiconductor structure of claim 15 wherein the first insulator layer comprises an oxide.

20. The semiconductor structure of claim 15 wherein said gate region comprises:
a gate insulator layer over the first body region; and
a gate contact layer over the gate insulator layer.

21. The semiconductor structure of claim 15 further comprising:
a body extension region of the second conductivity type in the first epitaxial semiconductor layer adjacent to the first body region; and wherein said gate region comprises:
a gate insulator layer over the first body region; and
a gate contact layer over the gate insulator layer.

22. The semiconductor structure of claim 15 wherein said gate region comprises a gate insulator layer over the first body region, and a gate contact layer over the gate insulator layer; and further comprising:
a body-extension region of the second conductivity type in the first epitaxial semiconductor layer adjacent to the first body region; and
a source contact region adjacent to the body-extension and source regions.

23. The semiconductor structure of claim 15 wherein the semiconductor layer has a doping concentration between $5 \times 10^{14}$ and $5 \times 10^{16}$ atoms/cm$^3$; and wherein the first epitaxial semiconductor layer has a doping concentration between $1 \times 10^{15}$ and $1 \times 10^{17}$ atoms/cm$^3$.

24. The semiconductor structure of claim 15 wherein the semiconductor layer comprises an upper surface; and wherein the first epitaxial semiconductor layer extends a vertical distance from the upper surface, the vertical distance being between 10 and 70 µm.

25. The semiconductor structure of claim 15 wherein each trench has a width between 1.5 and 4 µm.

26. The semiconductor structure of claim 15 further comprising:
a first gate insulator layer over the first body region;
a first gate contact layer over the first gate insulator layer;
a second body region of the second conductivity type in the semiconductor layer adjacent to the first epitaxial semiconductor layer;
a second gate insulator layer over the second body region; and
a second gate contact layer over the second gate insulator layer.

27. The semiconductor structure of claim 15 further comprising:
a first body-extension region of the second conductivity type in the first epitaxial semiconductor layer adjacent to the first body region;
a first gate insulator layer over the first body region;
a first gate contact layer over the first gate insulator layer;
a second body region of the second conductivity type in the semiconductor layer adjacent to the first epitaxial semiconductor layer;
a second body-extension region of the second conductivity type in the first epitaxial semiconductor layer adjacent to the second body region;
a second gate insulator layer over the second body region; and
a second gate contact layer over the second gate insulator layer.

28. The semiconductor structure of claim 15 further comprising a doping transition region between the semiconductor layer and the first epitaxial semiconductor layer.

29. The semiconductor structure of claim 15 further comprising:
a second epitaxial semiconductor layer extending into the semiconductor layer and of the second conductivity type; and
a second insulator layer extending into the second epitaxial semiconductor layer.

30. The semiconductor structure of claim 29 further comprising:
a first gate insulator layer over the first body region;
a first gate contact layer over the gate insulator layer;
a second body region of the second conductivity type in the semiconductor layer adjacent to the second epitaxial semiconductor layer;

a second gate insulator layer over the second body region; and a second gate contact layer over the second gate insulator layer.

31. The semiconductor structure of claim 29 wherein the first and second epitaxial semiconductor layers are spaced apart by 2 to 8 µm.

32. The semiconductor structure of claim 29 wherein the first and second insulator layers are spaced apart by 2.5 to 12 µm.

* * * * *